(12) United States Patent
Chang et al.

(10) Patent No.: US 12,426,344 B2
(45) Date of Patent: Sep. 23, 2025

(54) METHOD OF MANUFACTURING SEMICONDUCTOR DEVICE

(71) Applicant: National Yang Ming Chiao Tung University, Hsinchu (TW)

(72) Inventors: Edward Yi Chang, Hsinchu County (TW); Shih-Chien Liu, Taoyuan (TW); Chung-Kai Huang, Kaohsiung (TW); Chia-Hsun Wu, Kaohsiung (TW); Ping-Cheng Han, Taichung (TW); Yueh-Chin Lin, New Taipei (TW); Ting-En Hsieh, Tainan (TW)

(73) Assignee: National Yang Ming Chiao Tung University, Hsinchu (TW)

( * ) Notice: Subject to any disclaimer, the term of this patent is extended or adjusted under 35 U.S.C. 154(b) by 418 days.

(21) Appl. No.: 18/303,585

(22) Filed: Apr. 20, 2023

(65) Prior Publication Data

US 2023/0261083 A1 Aug. 17, 2023

Related U.S. Application Data

(60) Division of application No. 16/809,529, filed on Mar. 4, 2020, now Pat. No. 11,670,699, which is a
(Continued)

(30) Foreign Application Priority Data

Dec. 15, 2016 (TW) .................. 105141643

(51) Int. Cl.
*H01L 29/51* (2006.01)
*H01L 21/28* (2006.01)
*H01L 29/423* (2006.01)

(52) U.S. Cl.
CPC ...... *H01L 29/516* (2013.01); *H01L 29/40117* (2019.08); *H01L 29/4234* (2013.01)

(58) Field of Classification Search
CPC ............ H01L 29/516; H01L 29/40117; H01L 29/4234; H01L 29/2003; H01L 29/4236;
(Continued)

(56) References Cited

U.S. PATENT DOCUMENTS

| 7,932,539 B2 | 4/2011 | Chen et al. |
| 2002/0125518 A1* | 9/2002 | Haneder ............... H01L 29/516 257/295 |

(Continued)

FOREIGN PATENT DOCUMENTS

| CN | 1376311 A | 10/2002 |
| CN | 101916782 A | 12/2010 |

(Continued)

OTHER PUBLICATIONS

Youn-Seon Kang et al., "Ferroelectric PZT/AlGaN/GaN field effect transistors," Proceedings of SPIE, vol. 6121, 61210S, 2006.
(Continued)

*Primary Examiner* — Shahed Ahmed
(74) *Attorney, Agent, or Firm* — CKC & Partners Co., LLC

(57) ABSTRACT

A method of manufacturing a semiconductor device includes providing a substrate. A channel layer is formed on the substrate. A barrier layer is formed on the channel layer. A source and a drain are formed on the barrier layer. A recess is formed in the barrier layer, in which the recess has a bottom surface, and a portion of the barrier underneath the recess has a thickness. A first dielectric layer is formed to cover the bottom surface of the recess. A charge trapping layer is formed on the first dielectric layer. A first ferroelectric material layer is formed on the charge trapping layer. A second dielectric layer is formed on the first ferroelectric material layer. A second ferroelectric material layer is
(Continued)

formed on the second dielectric layer. A gate is formed over the second ferroelectric material layer.

8 Claims, 7 Drawing Sheets

Related U.S. Application Data continuation-in-part of application No. 15/644,830, filed on Jul. 10, 2017, now abandoned.

(58) Field of Classification Search
CPC ........... H01L 29/42352; H01L 29/7786; H01L 29/7841; H01L 29/792; H01L 29/40111; H01L 29/778–7789; H01L 29/15–158; H01L 27/11585–11597; H01L 29/6684; H01L 29/78391; H01L 29/122–127; H01L 29/66462; H01L 29/66431; H10B 51/00–50; H10D 64/689; H10D 30/694; H10D 64/037; H10D 30/012; H10D 30/687; H10D 62/058
See application file for complete search history.

(56) References Cited

U.S. PATENT DOCUMENTS

| | | |
|---|---|---|
| 2004/0004859 A1 | 1/2004 | Forbes et al. |
| 2008/0296618 A1 | 12/2008 | Suh et al. |
| 2012/0161153 A1 | 6/2012 | Yumoto et al. |
| 2012/0217507 A1 | 8/2012 | Ohki |
| 2013/0056746 A1* | 3/2013 | Joshin ................. H01L 29/0847 257/E29.246 |
| 2016/0284830 A1* | 9/2016 | Shimizu ............... H01L 29/7786 |
| 2016/0308070 A1 | 10/2016 | Chang et al. |
| 2017/0141235 A1* | 5/2017 | Lai ........................ H01L 29/6684 |
| 2020/0328287 A1* | 10/2020 | Chen ..................... H01L 29/516 |

FOREIGN PATENT DOCUMENTS

| | | |
|---|---|---|
| JP | 5-235370 A | 9/1993 |
| JP | 2009-4743 A | 1/2009 |
| JP | 2013-55148 A | 3/2013 |
| JP | 2013131736 A | 7/2013 |
| JP | 2013168433 A | 8/2013 |
| JP | 2014-99517 A | 5/2014 |
| TW | I466292 B | 12/2014 |

OTHER PUBLICATIONS

Yong Cai et al., "Control of Threshold Voltage of AlGaN/GaN HEMTs by Fluoride-Based Plasma Treatment: From Depletion Mode to Enhancement Mode," IEEE Transaction on Electron Devices, vol. 53, No. 9, Sep. 2006, pp. 2207-2215.

Yasuhiro Uemoto et al., "Gate Injection Transistor (GIT)—A Normally-Off AlGaN/GaN Power Transistor Using Conductivity Modulation," IEEE Transaction on Electron Devices, vol. 54, No. 12, Dec. 2007, pp. 3393-3399.

* cited by examiner

METHOD OF MANUFACTURING SEMICONDUCTOR DEVICE

RELATED APPLICATIONS

The present application is a divisional of the application Ser. No. 16/809,529, filed on Mar. 4, 2020, which is a Continuation-in-part of U.S. application Ser. No. 15/644,830, filed on Jul. 10, 2017, which claims priority to Taiwan Application Serial Number 105141643, filed Dec. 15, 2016, the entirety of which is incorporated by reference herein.

BACKGROUND

Field of Invention

The present invention relates to a method of manufacturing a semiconductor device. More particularly, the present invention relates to a method of manufacturing a high electron mobility transistor.

Description of Related Art

In semiconductor technologies, III-V compound semiconductors can be used to form a variety of integrated circuit devices, such as high power field effect transistors, high frequency transistors, and high electron mobility transistors (HEMTs). The III-V compound semiconductors have the potential to replace the semiconductor material of the traditional silicon transistors.

However, when the III-V compound semiconductor is gallium nitride or gallium oxide, the channel of the device is in the normally-on state. Since the threshold voltage of a normally-on transistor is a negative value, current in the transistor is still in the conducting state when the transistor is at zero gate bias and it causes an extra power loss. Currently, methods to solve this problem, such as thinning of the gallium nitride layer, ion implantation, or the use of p-type gallium oxide, propose approaches to increase the threshold voltage to a level of higher than 0V. However, the threshold voltage of the transistor should be more than 6V to prevent the abnormal turn-on caused by an unstable fluctuation of the gate voltage. Nowadays, most of the methods proposed by the academic and industrial fields provide ways to add additional circuits to resolve this issue. However, those methods cause the parasitic effect and result in the unnecessary energy loss. The conventional methods also cause the increase in manufacturing cost. The embodiments of the present application can increase the threshold voltage of the transistors to be more than 6V and allow the transistors to have excellent characteristics.

SUMMARY

According to various embodiments of the present application, a semiconductor device is provided. The semiconductor device includes a substrate, a channel layer, a barrier layer, a first dielectric layer, a charge trapping layer, a first ferroelectric material, a second dielectric layer, a second ferroelectric material layer, a gate, a source and a drain. The channel layer is disposed on the substrate. The barrier layer is disposed on the channel layer. The barrier layer has a recess, and a portion of the barrier layer under the recess has a thickness. The source and the drain are disposed on the barrier layer. The first dielectric layer covers a bottom surface of the recess. The charge trapping layer is disposed on the first dielectric layer. The first ferroelectric material is disposed on the charge trapping layer. The second dielectric layer is disposed on the first ferroelectric material layer. The second ferroelectric material layer is disposed on the second dielectric layer. The gate is disposed over the second ferroelectric material layer.

In some embodiments, the semiconductor device further includes a third dielectric layer disposed between the first ferroelectric material layer and the charge trapping layer.

In some embodiments, each of the first dielectric layer, the second dielectric layer and the third dielectric layer has a bandgap, and the bandgap respectively ranges between 7 eV and 12 eV.

In some embodiments, the thickness of the portion of the barrier layer under the recess ranges between 5 nm and 15 nm.

In some embodiments, the first and the second ferroelectric material layers respectively include a layer made of $BaTiO_3$, $KH_2PO_4$, $HfZrO_2$, $SrBi_2Ta_2O_9$, or $PbZrTiO_3$.

In some embodiments, the recess has a depth, and the first dielectric layer has a thickness that is smaller than the depth.

In some embodiments, the recess has a first vertical sidewall and a second vertical sidewall opposite to the first vertical sidewall, and a first distance between the source and the first sidewall is smaller than a second distance between the drain and the second vertical sidewall.

In some embodiments, the semiconductor device further includes a first passivation layer covering a portion of the barrier layer.

In some embodiments, the semiconductor device further includes a second passivation layer disposed on the first passivation layer.

According to various embodiments of the present application, the invention provides a method of manufacturing a semiconductor device. The method includes: providing a substrate; forming a channel layer on the substrate; forming a barrier layer on the channel layer; forming a source and a drain on the barrier layer; forming a recess in the barrier layer, the recess having a bottom surface and a portion of the barrier underneath the recess having a thickness; forming a first dielectric layer covering the bottom surface of the recess; forming a charge trapping layer on the first dielectric layer; forming a first ferroelectric material layer on the charge trapping layer; forming a second dielectric layer on the first ferroelectric material layer; forming a second ferroelectric material layer on the second dielectric layer; and forming a gate over the second ferroelectric material layer.

In some embodiments, forming the first ferroelectric material layer and the second ferroelectric material layer includes plasma enhanced atomic layer deposition, metal-organic chemical vapor deposition (MOCVD), chemical vapor deposition, physical vapor deposition, sputtering, or pulsed laser evaporation.

In some embodiments, forming the first ferroelectric material layer includes heating the first ferroelectric material layer to a first temperature, wherein the first temperature is higher than a crystallization temperature of the first ferroelectric material layer; and cooling down the first ferroelectric material layer to a second temperature to crystallize the first ferroelectric material layer.

In some embodiments, the first temperature ranges between 400° C. and 600° C., and the second temperature ranges between 25° C. and 100° C.

In some embodiments, forming the second ferroelectric material layer includes heating the second ferroelectric material layer to a third temperature, wherein the third temperature is higher than a crystallization temperature of the second ferroelectric material layer; and cooling down the second ferroelectric material layer to a fourth temperature to crystallize the second ferroelectric material layer.

In some embodiments, the third temperature ranges between 400° C. and 600° C., and the fourth temperature ranges between 25° C. and 100° C.

In some embodiments, before forming the first dielectric layer covering the bottom surface of the recess, further comprising forming a first passivation layer covering a portion of the barrier layer.

In some embodiments, after forming the gate over the second ferroelectric material layer, further comprising forming a second passivation layer covering the first passivation layer.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
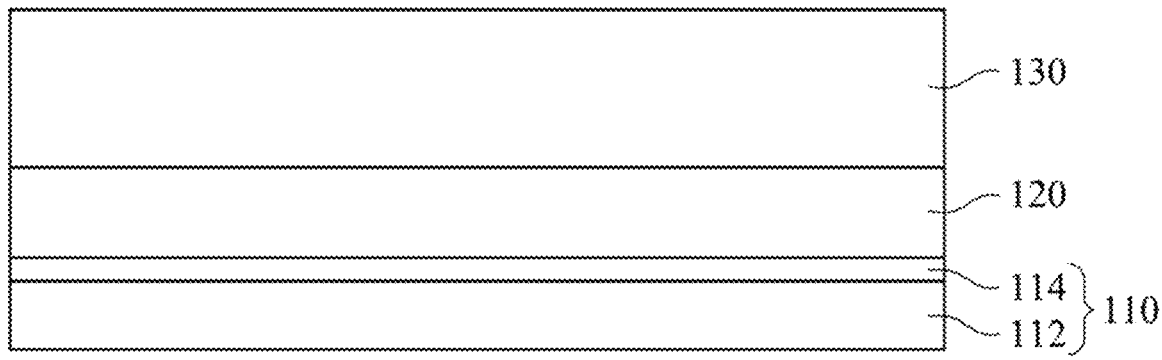
FIG. 1, FIG. 2, FIG. 3, FIG. 4A, FIG. 4B, FIG. 4C, FIG. 4D and FIG. 4E are cross-sectional views illustrating various stages of the method of manufacturing a semiconductor device according to various embodiments of this invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a semiconductor device and a method of manufacturing the semiconductor device are provided hereinafter. The structure and the characteristics of the semiconductor device and the steps or operations of manufacturing the semiconductor device are described in detail hereinafter.

In recent years, high electron mobility transistors (HEMTs) have been widely applied to high-power circuit systems due to the excellent characteristics, such as a high output power, a high breakdown voltage, and an excellent resistance to high temperatures. Since a large number of polarized charges exist between the channel layer and the barrier layer of the high electron mobility transistor known in the art, these polarized charges form a two dimensional electron gas (2DEG) and allow the electrons to have a high mobility. Under the circumstances, current in the transistor is still in the conducting state when no gate bias is applied to the transistor. The transistor is therefore called a normally-on transistor. The threshold voltage of normally-on transistor is a negative value. That is, current is still in the conducting state when the transistor is at zero gate bias and thereby causes an extra power loss. Additionally, the normally-on transistor does not possess fail-safe characteristics, and it therefore has potential danger. Accordingly, the development of a normally-off transistor is an important topic in the development of the high-power transistors. Further, the high-power circuit systems need to be operated at a high bias voltage, and it may easily generate instantaneous voltage pulses at the high bias voltage. If the threshold voltage of the transistor is not high enough, the high power component may easily be abnormally turned on and thereby causes the abnormal operation of the circuit and impacts the stability thereof. Hence, the present invention provides a high electron mobility transistor device having a high threshold voltage, which is a normally-off high electron mobility transistor, and it can retain high output current in the meanwhile.

FIGS. 1-4E are cross-sectional views illustrating various stages of the method of manufacturing a semiconductor device according to various embodiments of this invention.

In FIG. 1, a substrate 110 is provided. The substrate 100 includes a base substrate 112 and a buffer layer 114. The buffer layer 114 is disposed on the base substrate 112. In examples, the base substrate 112 is a silicon (Si) substrate, a silicon carbide (SiC) substrate, a sapphire substrate, a gallium nitride (GaN) substrate, an aluminum gallium nitride (AlGaN) substrate, an aluminum nitride (AlN) substrate, a gallium phosphide (GaP) substrate, a gallium arsenide (GaAs) substrate, an aluminum gallium arsenide (AlGaAs) substrate, or other substrates including III-V compounds. In examples, the buffer layer 114 includes a layer of GaN or GaN having p-type dopants. The buffer layer 114 may be formed by epitaxial processes or other suitable processes. For example, the p-type dopants include carbon, iron, magnesium, zinc, or other suitable p-type dopants. The buffer layer 114 can lower leakage current and prevent the cracks in the channel layer 120 when forming the channel layer 120. In another embodiment, the substrate 110 includes a base substrate 112, a crystal seed layer (not shown) and a buffer layer 114. The crystal seed layer is disposed on the base substrate 112. The buffer layer 114 is disposed on the crystal seed layer. The crystal seed layer may facilitate to compensate the lattice mismatch between the base substrate 112 and the buffer layer 114.

A channel layer 120 is then formed on the substrate 110. Next, a barrier layer 130 is formed on the channel layer 120. In examples, the channel layer 120 may be a layer made of AlGaN, GaN, indium gallium nitride (InGaN), aluminum indium gallium nitride (AlInGaN), or compounds including III-V elements. In examples, the barrier layer 130 includes a layer of AlN, aluminum indium nitride (AlInN), AlGaN, GaN, InGaN, AlInGaN, or compounds including III-V elements. The band gap of the channel layer 120 is less than the band gap of the barrier layer 130. The selection of the materials and the thicknesses of the channel layer 120 and the barrier layer 130 should be able to generate a two dimensional electron gas. In one example, each of the channel layer 120 and the barrier layer 130 may be a multi-layered structure. In another embodiment, some other layers may be further formed. For example, an intermediate layer (not shown) may be formed between the channel layer 120 and the barrier layer 130. A doped layer (not shown) may be formed on the barrier layer 130 to increase electrons of the two dimensional electron gas. A capping layer (not shown) may be formed on the barrier layer 130 to prevent the barrier layer 130 from oxidization.

Figure 2:
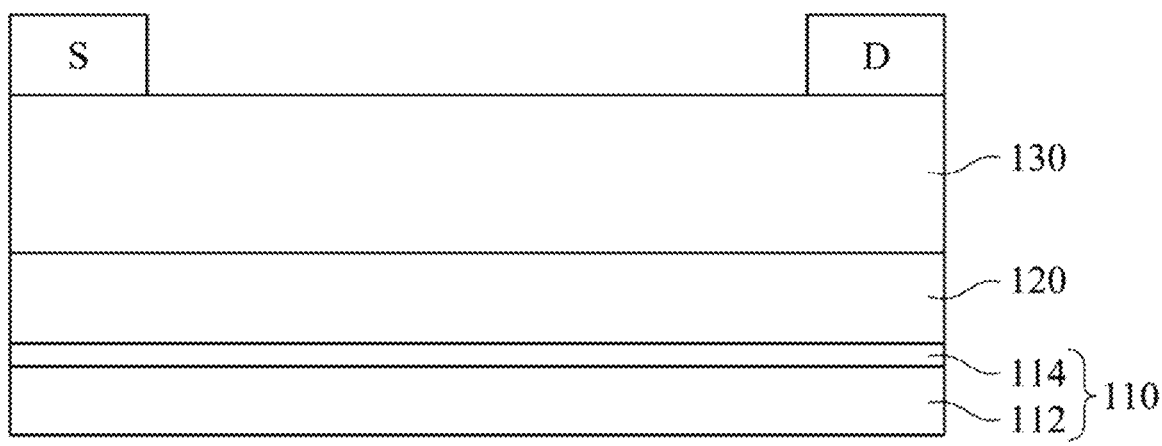

Referring to FIG. 2, a source S and a drain D are formed on the barrier layer 130. In examples, the material of each of the source S and the drain D is selected from, but not limited to, the group consisting of silver (Ag), copper (Cu), tungsten (W), titanium (Ti), tantalum (Ta), aluminum (Al), nickel (Ni), ruthenium (Ru), palladium (Pd), platinum (Pt), manganese (Mn), tungsten nitride (WN), titanium nitride (TiN), tantalum nitride (TaN), aluminum nitride (AlN), tungsten silicide (WSi), molybdenum nitride (MoN), nickel silicide ($Ni_2Si$), titanium silicide ($TiSi_2$), titanium aluminide (TiAl), arsenic-doped (As-doped) polycrystalline silicon, zirconium nitride (ZrN), tantalum carbide (TaC), TaCN, TaSiN, titanium aluminium nitride (TiAlN), silicide, and any combination thereof. The source S and drain D may be formed by using any process known in the art.

Figure 3:
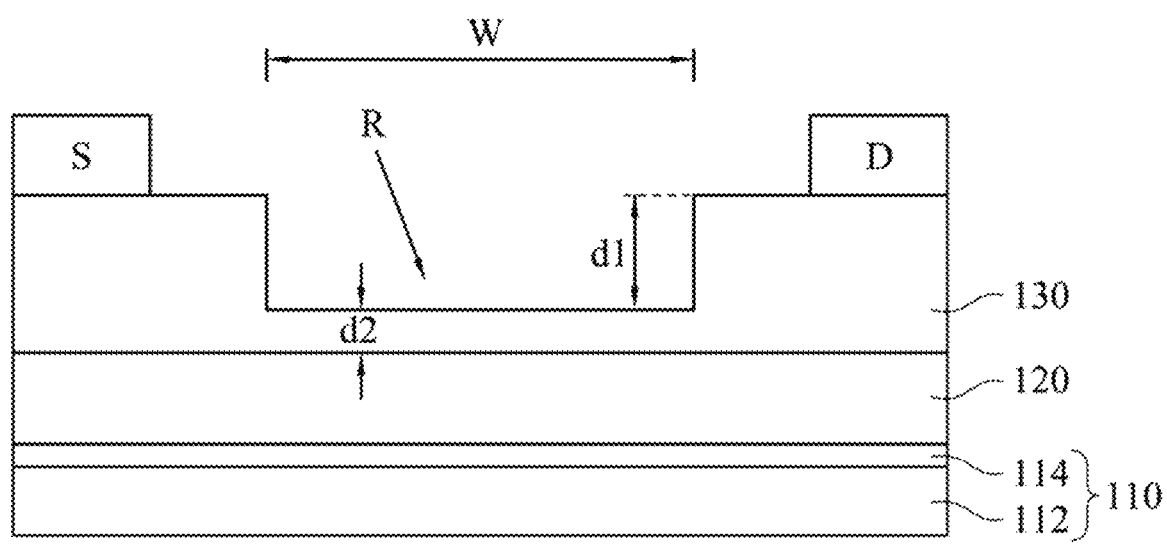

As shown in FIG. 3, a recess R is formed in the barrier layer 130 by a patterning process. In one embodiment, a masking layer such as a hard mask layer or a photoresist layer may be formed on the barrier layer 130, and the masking layer is patterned. The pattern of the masking layer is transferred to the underneath barrier layer 130 by an etching process to form the recess R. In examples, the etching process may be a reactive ion etching process, a plasma dry etching process or other anisotropic etching processes. For example, the etching gas may be $SF_6$, $SiCl_4$, $C_4F_8$, $CH_4$, $H_2$, Ar, or other known etching gases, or a combination thereof. In another embodiment, the recess R is formed by a wet etching process after forming the masking layer to smooth the bottom corners of the recess R.

The recess R has a depth d1 and a width W. In some embodiments, the depth d1 ranges from 15 nm to 25 nm, such as 15 nm, 20 nm or 25 nm. The width W ranges from 0.1 μm to 3 μm, such as 0.5 μm, 1 μm, 2 μm or 2.5 μm. The recess R is disposed between the source S and the drain D, and the recess R does not penetrate through the barrier layer 130. The purpose of the recess R is to attenuate the polarization of the barrier layer 130 and eliminate the carriers of the two dimensional electron gas such that the threshold voltage may be more than 0V. A relatively thin barrier layer may raise the energy level of the conduction band. Therefore, decreasing in the thickness of the barrier layer underneath the gate region can deplete the two dimensional electron gas. The portion of the barrier layer 130 between the bottom surface of the recess R and the top surface of the channel layer 120 has a thickness d2. The thickness d2 ranges from 0 nm to 10 nm, such as 1 nm, 3 nm, 5 nm or 8 nm. It should be noticed that if the thickness d2 is thicker than 10 nm, the barrier layer 130 may have a large number of polarized charges and hence the channel turns into a normally-on state.

In some examples, the width W of the recess R is less than 3 μm, such as 0.05 μm, 0.5 μm, 1 μm or 2 μm. In examples, the distance between the recess R and the source S is different from the distance between the recess R and the drain D. For example, the distance between the edge of the recess R and the source S ranges from 1 μm to 3 μm, such as 1.5 μm, 2 μm or 2.5 μm. The distance between the edge of the recess R and the drain D ranges from 5 μm to 15 μm, such as 7.5 μm, 10 μm or 12.5 μm.

FIGS. 4A-4E illustrate different embodiments of the ferroelectric composite material layer. As shown in FIGS. 4A-4E, the ferroelectric composite material layer is formed in the recess R after the formation of the recess R. In some embodiments, the ferroelectric composite material layer may be formed by a plasma enhanced atomic layer deposition process, a metal-organic chemical vapor deposition (MOCVD) process, a chemical vapor deposition process, a physical vapor deposition process, a sputtering process, or pulsed laser evaporation process. After forming the ferroelectric composite material layer, a patterning process may optionally be used to trim the ferroelectric composite material layer such that the sidewalls of the ferroelectric composite material layer are aligned with the sidewalls of the recess R. In examples, the width of the ferroelectric composite material layer is equal to the width W of the recess R.

Figure 4A:
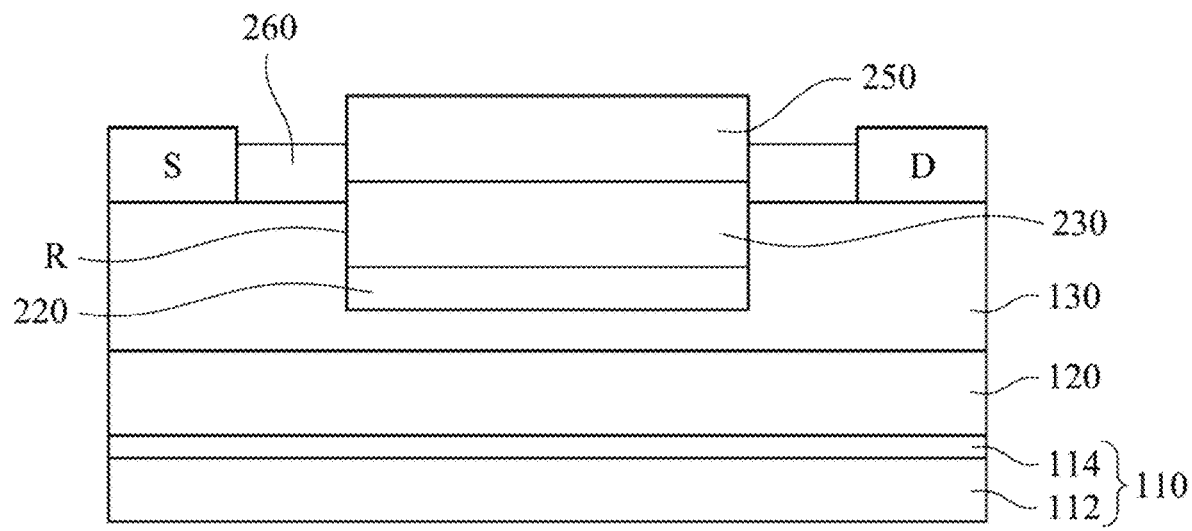

In FIG. 4A, the ferroelectric composite material layer includes a charge trapping layer 220 (or so-called a charge storage layer) and a ferroelectric material layer 230. The charge trapping layer 220 covers the bottom surface of the recess R. The ferroelectric material layer 230 is disposed on the charge trapping layer 220. The gate 250 is disposed over the ferroelectric material layer 230. The passivation layer 260 covers a portion of the barrier layer 130. In examples, the charge trapping layer 220 may include a nanocrystal layer embedded in an insulating material, or a dielectric layer made of silicon nitrides, HfON, $HfO_2$ or $ZrO_2$. The thickness of the charge trapping layer 220, for example, ranges from 1 nm to 4 nm, such as 1.5 nm, 2 nm, 2.5 nm or 3 nm. The thickness of the charge trapping layer 220 depends on the characteristics of the chosen material. In one example, the charge trapping layer 220 is a multi-layered structure which may include any combination of the foregoing materials of the charge trapping layer 220. In some embodiments, the passivation layer 260 may include one or multiple layer. In one example, the passivation layer 260 may include AlN, $Al_2O_3$, AlON, SiN, $SiO_2$, SiON or $Si_3N_4$.

In various examples, the ferroelectric material layer 230 includes a layer made of $BaTiO_3$, $KH_2PO_4$, $HfZrO_2$, $SrBi_2Ta_2O_9$ (SBT), $PbZrTiO_3$ (PZT) or other materials that can trigger the ferroelectric effect. The ferroelectric material refers to a material having characteristics of spontaneous polarization and polarization transition in an external electric field. The ferroelectric effect refers to an effect that electric dipoles will align with the direction of an electric field when the external electric field is applied, and the remnant polarization (Pr) in the polarization direction is still retained after the removal of the external electric field. For any ferroelectric material, the remnant polarization indicates that the ferroelectric material has a characteristic of permanent polarization. After the formation of the ferroelectric material layer 230, a thermal annealing process is performed to treat the ferroelectric material layer 230. The ferroelectric material layer 230 is heated to a first temperature, and the first temperature is higher than the crystallization temperature (Tc) thereof. The ferroelectric material layer 230 is then cooled down to a second temperature to crystallize the ferroelectric material layer 230 and become a material having the ferroelectric effect. In examples, the first temperature ranges between 400° C. and 600° C., such as 450° C., 500° C. or 550° C. The second temperature ranges between 25° C. and 100° C., such as 25° C. or 80° C.

Figure 4B:
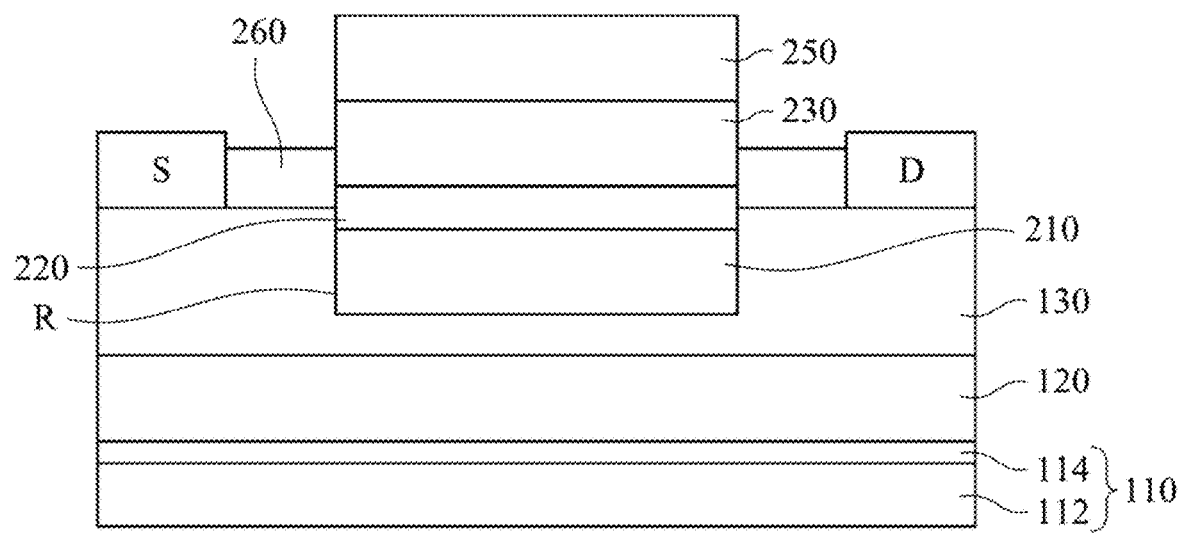

In FIG. 4B, another embodiment of the ferroelectric composite material layer is provided. In the embodiment, a first dielectric layer 210 is firstly formed in the recess R. The charge trapping layer 220 is then formed on the first dielectric layer 210. Next, the ferroelectric material layer 230 is formed on the charge trapping layer 220. Afterwards, the gate 250 is formed on the ferroelectric material layer 230. The passivation layer 260 covers the barrier layer 130. The first dielectric layer 210 functions as a barrier layer with a wide bandgap. The bandgap of the first dielectric layer 210 is between 7 eV and 12 eV, such as 8 eV, 9 eV, or 11 eV. The first dielectric layer 210 may decrease leakage current of the semiconductor device and increase the breakdown voltage of the gate 250. The first dielectric layer 210 includes a layer of $Al_2O_3$, $SiO_2$ or other materials having bandgaps between 7 eV and 12 eV. The methods of forming the charge trapping layer 220 and the ferroelectric material layer 230 may be the same as these described hereinbefore in connection with FIG. 4A, and are not repeated herein.

Figure 4C:
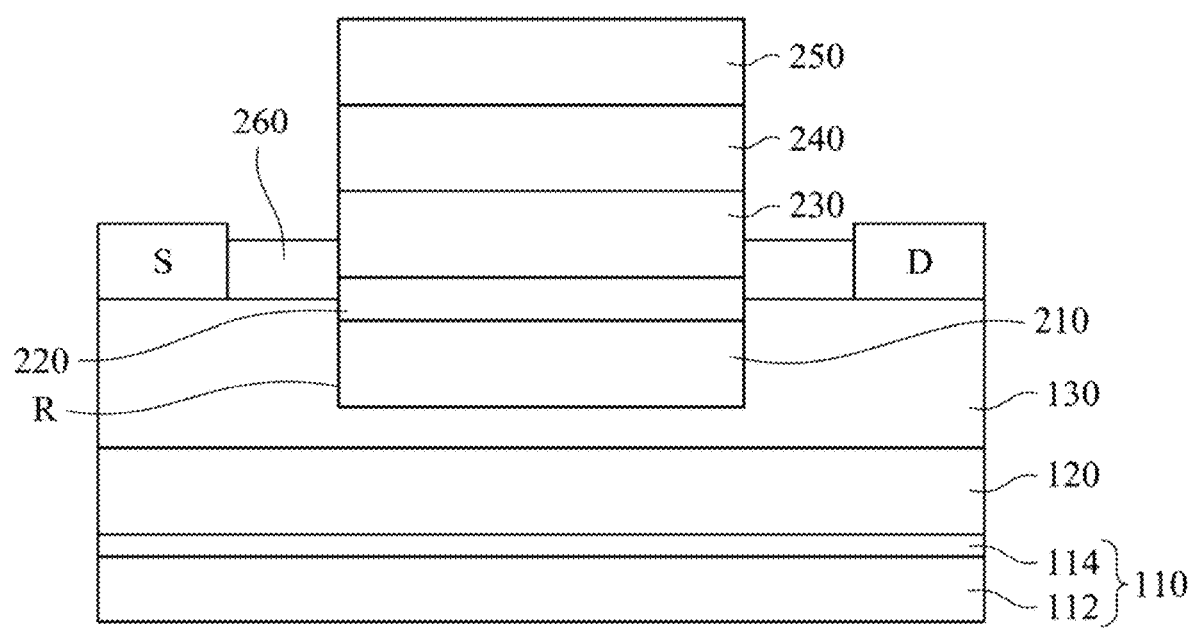

In FIG. 4C, another embodiment of the ferroelectric composite material layer is provided. The ferroelectric composite material layer includes the first dielectric layer 210, the charge trapping layer 220, the ferroelectric material layer 230 and a second dielectric layer 240. The first dielectric layer 210 is disposed in the recess R. The charge trapping layer 220 is disposed on the first dielectric layer 210. The ferroelectric material layer 230 is disposed on the charge trapping layer 220. The second dielectric layer 240 is disposed on the ferroelectric material layer 230. The gate 250 is disposed on the second dielectric layer 240. The passivation layer 260 covers the barrier layer 130. The first dielectric layer 210 and the second dielectric layer 240 function as barrier layers having wide bandgaps. The bandgap of each of the first dielectric layer 210 and the second dielectric layer 240 is between 7 eV and 12 eV, such as 8 eV, 9 eV, or 11 eV. The first dielectric layer 210 and the second dielectric layer 240 may decrease leakage current of the semiconductor device and increase the breakdown voltage of the gate 250. The second dielectric layer 240 includes a layer of $Al_2O_3$, $SiO_2$ or other materials having bandgaps between 7 eV and 12 eV.

In the semiconductor devices of the present application, when a positive voltage is applied to the gate 250, and the ferroelectric material layer 230 may be polarized and collect charges. The charge trapping layer 220 provides a place for storing the charges. Meanwhile, the bandgaps of the channel layer 120 and the barrier layer 130 underneath the gate 250 and the ferroelectric composite material layer begin to change, and further the negative electric potential of the surface of the barrier layer 130 increases, thereby increasing the threshold voltage of the semiconductor device to a positive value.

In one embodiment, after the ferroelectric material layer 230 is polarized, the delta value of the threshold voltages of the semiconductor device may be larger than 5V. The threshold voltage of the semiconductor device changes from about 0V to a value larger than 5V. That is, the semiconductor device becomes an enhanced semiconductor device. In another embodiment, the threshold voltage may be tuned by adjusting the depth of the recess R. In the condition where the thicknesses (d1+d2) of the barrier layer is kept the same, a thinner thickness d2 may result in a larger positive value of the threshold voltage. However, the maximum of drain current may be unfavorably decreased when thinning down the thickness d2, and hence the value of the thickness d2 should be controlled in a certain range.

Figure 4D:
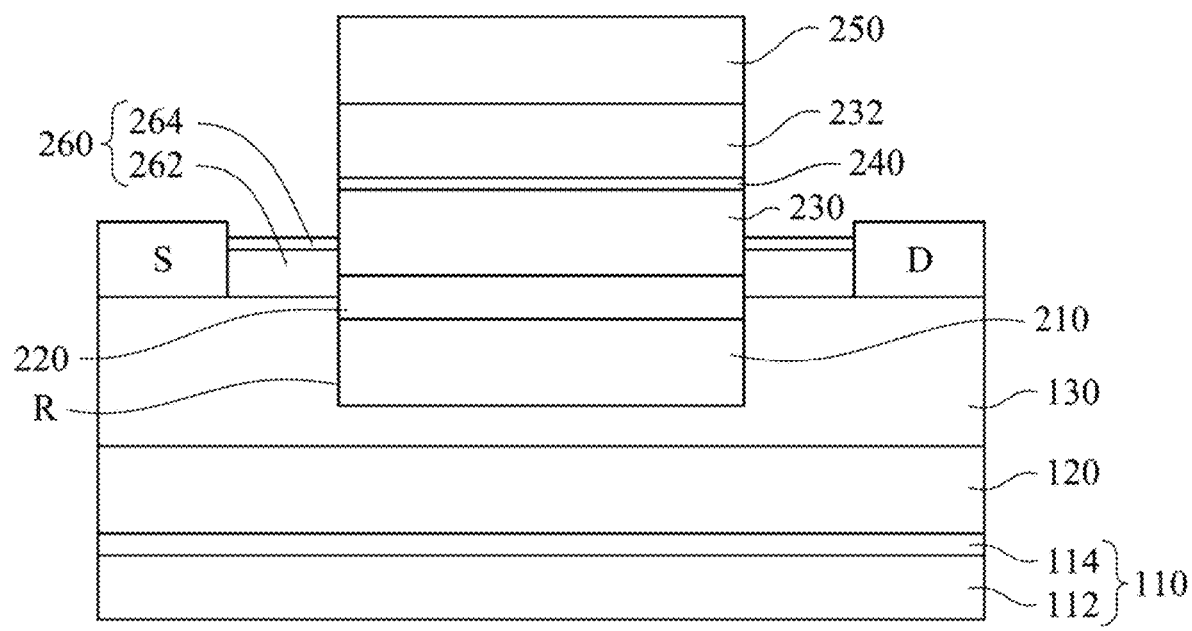

In FIG. 4D, another embodiment of the ferroelectric composite material layer is provided. The ferroelectric composite material layer includes the first dielectric layer 210, the charge trapping layer 220, a first ferroelectric material layer 230, the second dielectric layer 240 and a second ferroelectric material layer 232. As shown in FIG. 4D, the first dielectric layer 210, the charge trapping layer 220, the first ferroelectric material layer 230, the second dielectric layer 240, the second ferroelectric material layer 232 and the gate 250 are disposed in sequence in the recess R. The passivation layer 260 covers the barrier layer 130. The materials and the method of forming the first dielectric layer 210, the charge trapping layer 220, the second dielectric layer 240, the gate 250 and the passivation layer 260 may be the same as these described hereinbefore in connection with FIGS. 4A to 4C, and are not repeated herein.

In some embodiments, the first ferroelectric material layer 230 and the second ferroelectric material layer 232 respectively include $BaTiO_3$, $KH_2PO_4$, $HfZrO_2$, $SrBi_2Ta_2O_9$ (SBT), $PbZrTiO_3$ (PZT) or other materials that can trigger the ferroelectric effect. In some examples, the first ferroelectric material layer 230 has a material that is the same as that of the second ferroelectric material layer 232. In other examples, the material of the second ferroelectric material layer may be different from the first ferroelectric material layer 230. In some embodiments, the first ferroelectric material layer 230 and the second ferroelectric material layer 232 respectively has a thickness that is greater than that of the second dielectric layer 240. For example, the thickness of the second ferroelectric material layer 232 may be about 7.6 nm, and the thickness of the second dielectric layer 240 may be about 1 nm.

The method of forming the first ferroelectric material layer 230 may be the same as these described hereinbefore in connection with FIG. 4A to FIG. 4C, and are not repeated herein. The method of forming the second ferroelectric material layer 232 may be same as or similar to the method of forming first ferroelectric material layer 230. Specifically, after the formation of the second ferroelectric material layer 232, a thermal annealing process is performed to treat the second ferroelectric material layer 232. The second ferroelectric material layer 232 is heated to a third temperature that is higher than the crystallization temperature (Tc) thereof. The second ferroelectric material layer 232 is then cooled down to a fourth temperature to crystallize the second ferroelectric material layer 232 and become a material having the ferroelectric effect. In some examples, the third temperature ranges between 400° C. and 600° C., and the second temperature ranges between 25° C. and 100° C. In some examples, the third temperature and the fourth temperature may be substantially the same as that of the first temperature and the second temperature described above, respectively. In other embodiments, the third and fourth temperature may be different from that of the first and second temperature, respectively. The second ferroelectric material layer 232 enables the charge trapping layer 220 to store more charges, such that further increasing the threshold voltage of the semiconductor device to a positive value.

The passivation layer 260 may include a first passivation layer 262 and a second passivation layer 264 disposed on the first passivation layer 262. In some embodiments, the material of the second passivation layer 264 is the same as that of the first passivation layer 262. In other embodiments, the material of the second passivation layer 264 is different from that of the first passivation layer 262. As shown in FIG. 4D, the first passivation layer 262 may have a thickness that is greater than that of the second passivation layer 264. For example, the thickness of the first passivation layer 262 may be about 50 nm, and the thickness of the second passivation layer 264 may be about 15 nm. In some embodiments, the first passivation layer 262 is formed on the barrier layer 130 before forming the first dielectric layer 210 in the recess R. In some embodiments, the second passivation layer 264 is formed on the first passivation layer 262 after forming the gate 250 over the second ferroelectric material layer 232 to protect the semiconductor device from moisture or dust.

Figure 4E:
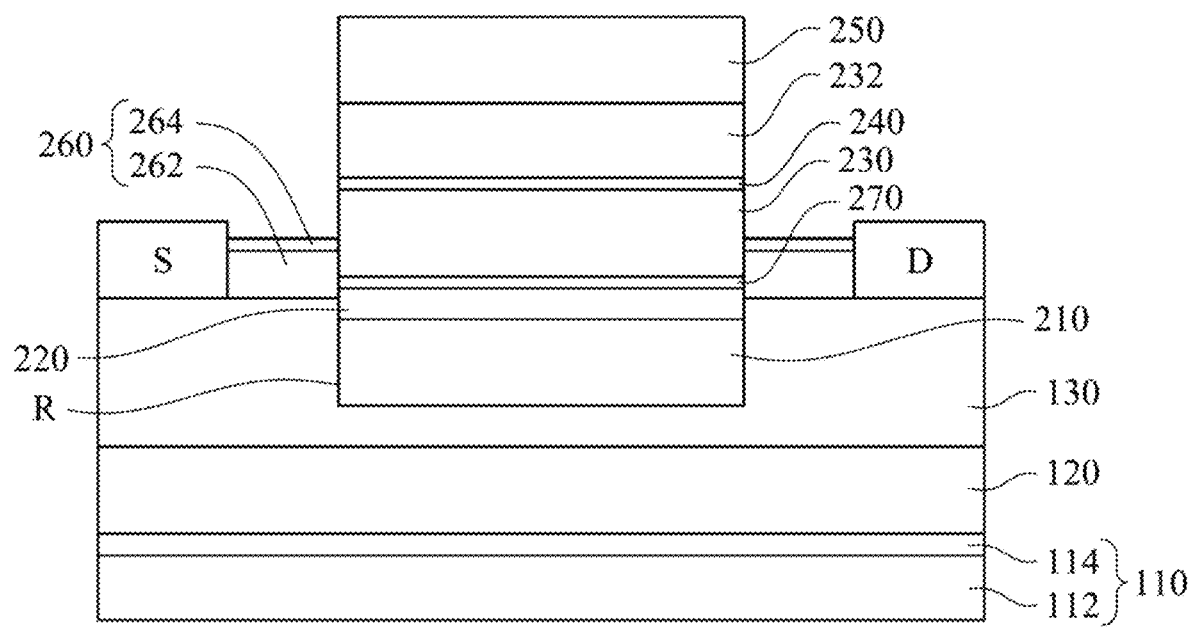

In FIG. 4E, another embodiment of the ferroelectric composite material layer is provided. The difference between the ferroelectric composite material layer shown in FIG. 4D and FIG. 4E is that the ferroelectric composite material layer shown in FIG. 4E further includes a third dielectric layer 270 disposed between the charge trapping layer 220 and the first ferroelectric material layer 230. In some embodiments, the third dielectric layer 270 includes a layer of $Al_2O_3$, $SiO_2$ or other materials having bandgaps between 7 eV and 12 eV, such as 8 eV, 9 eV, or 11 eV. In some examples, the first dielectric layer 210, the second dielectric layer 240, and the third dielectric layer 270 may include the same material, such as $Al_2O_3$. In some embodiments, the third dielectric layer 270 has a thickness that is substantially the same as that of the second dielectric layer 240, which has a thickness smaller than that of the first dielectric layer 210. As shown in FIG. 4E, the first ferroelectric material layer 230 is sandwiched between the second dielectric layer 240 and the third dielectric layer 270, such that the ferroelectricity of the ferroelectric material layer can be improved.

Figure 4F:
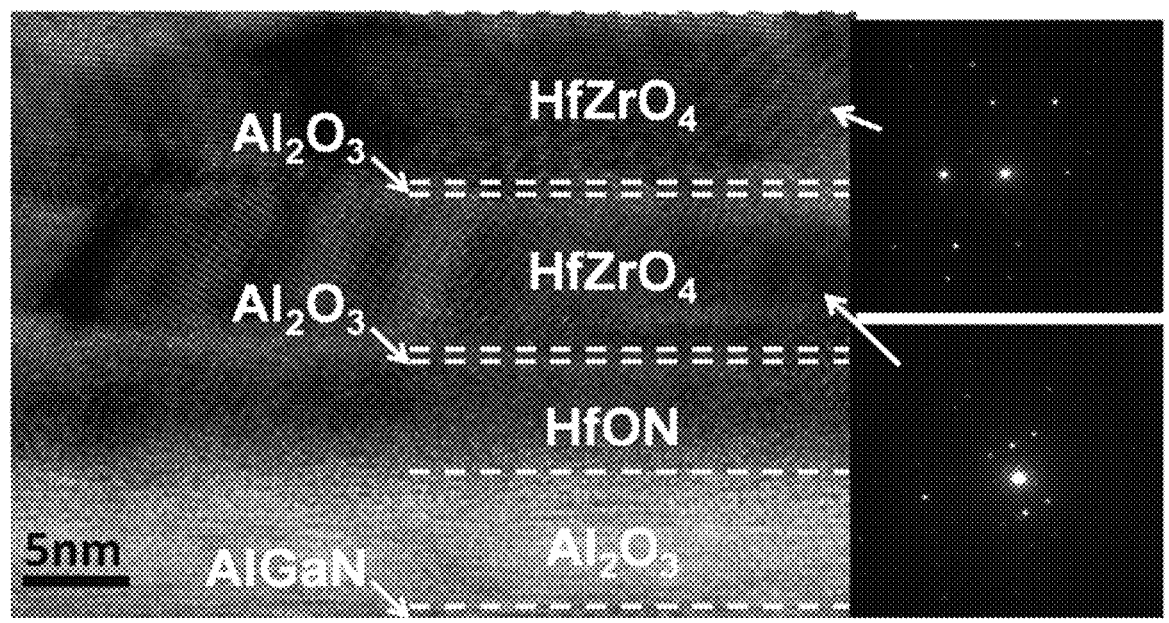
FIG. 4F is a Transverse Electron Microscope (TEM) image and diffraction pattern of the ferroelectric composite material layer according to some embodiments of this invention.

FIG. 4F is a Transverse Electron Microscope (TEM) image and diffraction pattern of the ferroelectric composite material layer according to some embodiments of this invention. The ferroelectric composite material layer may include a stack of a $Al_2O_3$ layer (first dielectric layer), a HfON layer (charge trapping layer), a $Al_2O_3$ layer (third dielectric layer), a $HfZrO_4$ layer (first ferroelectric material layer), a $Al_2O_3$ layer (second dielectric layer) and a $HfZrO_4$ layer (second ferroelectric material layer). As shown in FIG. 4F, the diffraction pattern of the second ferroelectric material layer shows better crystallinity crystalline perfection.

Figure 5A:
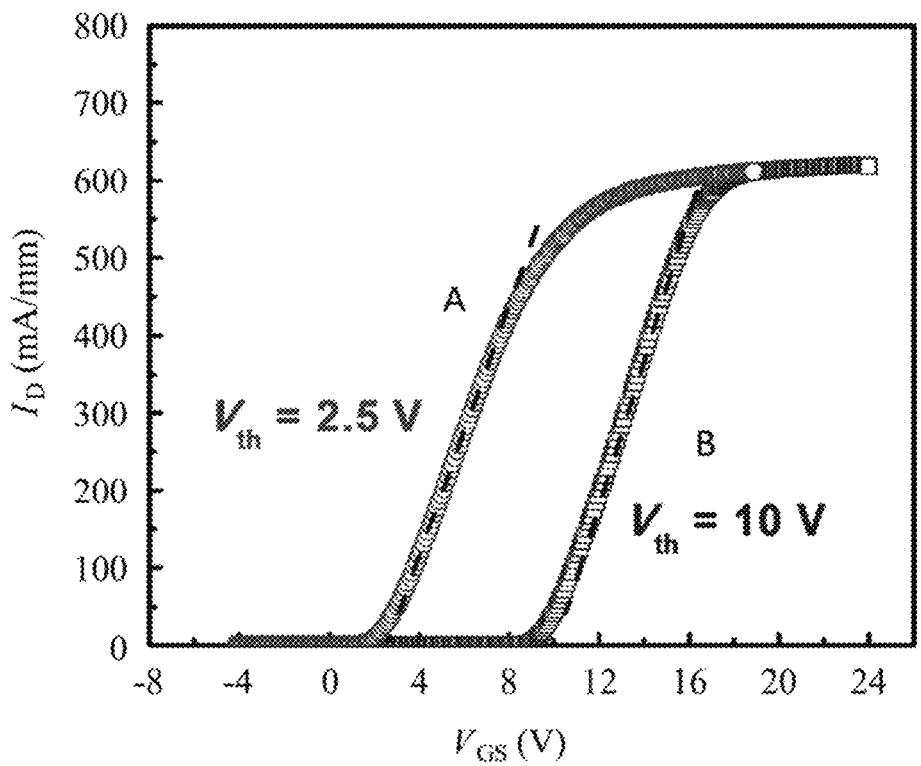
FIG. 5A and FIG. 5B depict the $I_D$-$V_{GS}$ curve of the semiconductor devices according to some embodiments of the invention.
Figure 5B:
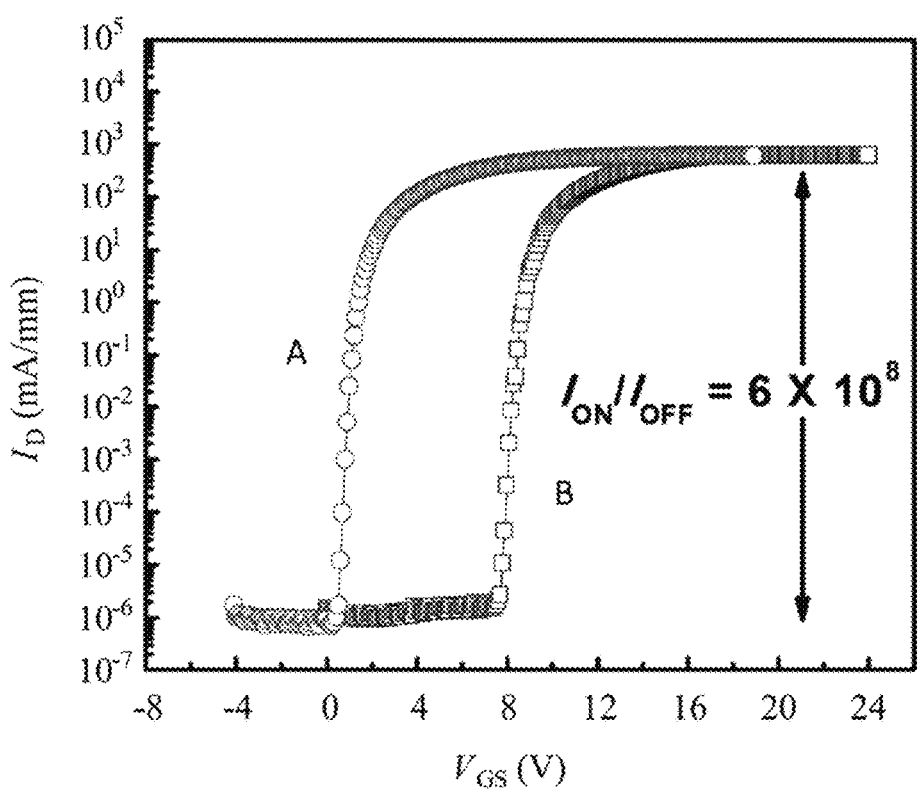

FIGS. 5A and 5B are $I_D$-$V_{GS}$ curves of the semiconductor devices in accordance with some embodiments of the present disclosure. In FIGS. 5A and 5B, curve A represents data associated with the ferroelectric material layer 230 before polarization, and curve B represents data associated with the ferroelectric material layer 230 after polarization. As shown in FIG. 5A, the threshold voltage of the semiconductor device changes from 2.5V to 10V after the polarization of the ferroelectric material layer 230. As shown in FIG. 5B, the $I_{on}/I_{off}$ ratio of the semiconductor device is $6 \times 10^8$.

In summary, the various embodiments of the present application provide a semiconductor device that utilizes the polarization of the ferroelectric material layer to change the bandgaps of the channel layer and the barrier layer. Therefore, the semiconductor device may have a relatively higher threshold voltage to attenuate extra power loss and improve the stability of the circuit system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:
   providing a substrate;
   forming a channel layer on the substrate;
   forming a barrier layer on the channel layer;
   forming a source and a drain on the barrier layer;
   forming a recess in the barrier layer, the recess having a bottom surface, wherein the barrier has a portion underneath the recess, and the portion has a thickness;
   forming a first dielectric layer covering the bottom surface of the recess;
   forming a charge trapping layer on the first dielectric layer;
   forming a first ferroelectric material layer on the charge trapping layer;
   forming a second dielectric layer on the first ferroelectric material layer;
   forming a second ferroelectric material layer on the second dielectric layer; and
   forming a gate over the second ferroelectric material layer.

2. The method of claim 1, wherein forming the first ferroelectric material layer and the second ferroelectric material layer comprises plasma enhanced atomic layer deposition, metal-organic chemical vapor deposition (MOCVD), chemical vapor deposition, physical vapor deposition, sputtering, or pulsed laser evaporation.

3. The method of claim 1, wherein forming the first ferroelectric material layer comprises:
   heating the first ferroelectric material layer to a first temperature, wherein the first temperature is higher than a crystallization temperature of the first ferroelectric material layer; and
   cooling down the first ferroelectric material layer to a second temperature to crystallize the first ferroelectric material layer.

4. The method of claim 3, wherein the first temperature ranges between 400° C. and 600° C., and the second temperature ranges between 25° C. and 100° C.

5. The method of claim 1 wherein forming the second ferroelectric material layer comprises:
   heating the second ferroelectric material layer to a third temperature, wherein the third temperature is higher than a crystallization temperature of the second ferroelectric material layer; and
   cooling down the second ferroelectric material layer to a fourth temperature to crystallize the second ferroelectric material layer.

6. The method of claim 5, wherein the third temperature ranges between 400° C. and 600° C., and the fourth temperature ranges between 25° C. and 100° C.

7. The method of claim 1, before forming the first dielectric layer covering the bottom surface of the recess, further comprising forming a first passivation layer covering a portion of the barrier layer.

8. The method of claim 7, after forming the gate over the second ferroelectric material layer, further comprising forming a second passivation layer covering the first passivation layer.

* * * * *